United States Patent [19]

Baynham

[11] 3,796,964

[45] Mar. 12, 1974

[54] NEGATIVE CONDUCTIVITY AMPLIFIERS AND OSCILLATORS

[75] Inventor: Alexander Christopher Baynham, Malvern, England

[73] Assignee: Minister of Technology in Her Britannic Majesty's Government of the United Kingdom of Great Britain and Northern Ireland, London, England

[22] Filed: Mar. 14, 1972

[21] Appl. No.: 234,585

Related U.S. Application Data

[63] Continuation of Ser. No. 21,463, March 20, 1970, abandoned.

[52] U.S. Cl. .................................. 330/5, 331/107 G
[51] Int. Cl. ............................ H03f 3/04, H03b 7/06
[58] Field of Search ...................... 330/5; 331/107 G

[56] References Cited

UNITED STATES PATENTS

| | | | |
|---|---|---|---|
| 3,611,192 | 10/1971 | Swartz | 330/5 |
| 3,621,462 | 11/1971 | Hammer et al. | 330/5 |
| 3,551,831 | 12/1970 | Kino et al. | 330/5 |
| 3,436,680 | 4/1969 | Hasty | 330/5 |
| 3,349,344 | 10/1967 | Chynoweth et al. | 330/5 |
| 3,477,029 | 11/1969 | Copeland | 330/5 |

*Primary Examiner*—Herman Karl Saalbach
*Assistant Examiner*—Darwin R. Hostetter
*Attorney, Agent, or Firm*—Elliott I. Pollock

[57] ABSTRACT

A solid state negative conductivity amplifier or oscillator in which a transverse electromagnetic wave is propagated inside a body of negative conductivity material. By varying the dimensions and the conductivity of the body of material and the surface reflection coefficients the device can be made into a broadband amplifier, a narrow band amplifier or an oscillator.

8 Claims, 9 Drawing Figures

Alexander Christopher Baynham
Inventor

By
Hall, Pollock & Vande Sande
Attorneys

Alexander Christopher Baynham
Inventor
By
Hall, Pollock & Vande Sande
Attorneys

Alexander Christopher Baynham
Inventor
By
Hall, Pollock & Vande Sande
Attorneys

NEGATIVE CONDUCTIVITY AMPLIFIERS AND OSCILLATORS

This is a continuation of application Ser. No. 21,463, filed Mar. 20, 1970, now abandoned.

BACKGROUND OF THE INVENTION

This invention belongs to the broad class of negative conductivity amplifiers and oscillators. Such devices generally work on material which has a region of negative slope in its voltage/current characteristic and can be biased to a point where the voltage/current curve shows a negative differential conductivity. However conventional negative conductivity solid state oscillators often require an external microwave circuit such as a waveguide. Furthermore in some cases a space-charge domain travels in the body of the oscillator. In these cases the frequency of oscillation or of narrow-band amplification is a function of the length of the body taken in the direction of the applied electric field. On the other hand, in the present case the frequency is a function of the length of the body taken in the direction of propagation of the transverse electromagnetic wave, which is at right angles to the direction of the applied electric field.

SUMMARY OF THE INVENTION

In accordance with the invention a solid state negative conductivity device comprises a body of material having a region of negative slope in its voltage/current characteristic, means for allowing a transverse electromagnetic wave to travel in the body of material, and means for extracting the transverse electromagnetic wave from the body of material.

The device may constitute a narrow band amplifier, in which case it will further comprise means for feeding a transverse electromagnetic wave into the body of material, and the product of the free carrier concentration and the length of the body in the direction of propagation of the transverse electromagnetic wave must be great enough for the amplifier gain to overcome the transmission loss through the surfaces of the body of material.

The device may constitute a broad band amplifier, in which case it will further comprise means for feeding a transverse electromagnetic wave into the body of material and matched surfaces where the transverse electromagnetic wave enters and leaves the body.

The device may constitute an oscillator, in which case the product of the free carrier concentration and the length of the body in the direction of propagation of the transverse electromagnetic wave must be such that $rr^* \exp(-2k_i a) > 1 \exp$ where $rr^*$ is the surface reflection coefficient, $k_i$ is the imaginary part of the propagation coefficient corresponding to the oscillation frequency and a is the length of the body in the direction of propagation of the transverse electromagnetic wave.

DETAILED DESCRIPTION

Transverse electromagnetic waves are attenuated in resistive media as a consequence of the real (in-phase) conductivity. If this conductivity is negative, then the conclusion that the wave will experience negative attenuation or gain readily follows. Although there are no known total negative resistance phenomena, a variety of negative differential resistances have been reported. Thus it is of interest to study the propagation of transverse electromagnetic waves within media which are biased into a region of negative differential conductivity.

Consider a transverse electromagnetic wave propagating in a direction $z$ having an electric vector in a direction $x$. A direction $y$ is defined normal to the $x$, $z$ plane in a right-handed co-ordinate system.

A complex propagation coefficient $(k_R + ik_i)$ corresponding to the real frequency, $(\omega/2\pi)$, is readily derived from Maxwell's equation in terms of the complex conductivity $(\sigma_R - i\sigma_i)$ $$k_R = k_o(\tfrac{1}{2}\epsilon_L)^{1/2}(1+\sigma_i/\epsilon_L + ((1+\sigma_i/\epsilon_L\omega)^2 + \sigma_R^2/\epsilon_L^2\omega^2)^{1/2})^{1/2} \quad (1)$$

and $$k_i = +(\sigma_R/|\sigma_R|)k_o(\tfrac{1}{2}\epsilon_L)^{1/2}(-1-\sigma_i/\epsilon_L\omega + ((1+\sigma_i/\epsilon_L\omega)^2 + \sigma_R^2/\epsilon_L^2\omega^2)^{1/2})^{1/2} \quad (2)$$

for a transverse electromagnetic wave having a periodicity of exp $(-i\omega t + i\,k \cdot z)$, where $k_o$ is the free space wave vector and $\epsilon_L$ is the lattice dielectric constant.

The complexity of the transport is contained within the terms $\sigma_R$ and $\sigma_i$. Furthermore it is observed that in a suitable material, and subject to certain other conditions discussed later, a d.c. bias field $E_o$ may be applied of such a magnitude that $\sigma_R$ becomes negative, implying inversion of the sign of $k_i$ in Equation (2). Transverse electromagnetic waves propagating across $E_o$, and having an E vector oriented parallel to $E_o$ will therefore grow.

Figure 1:
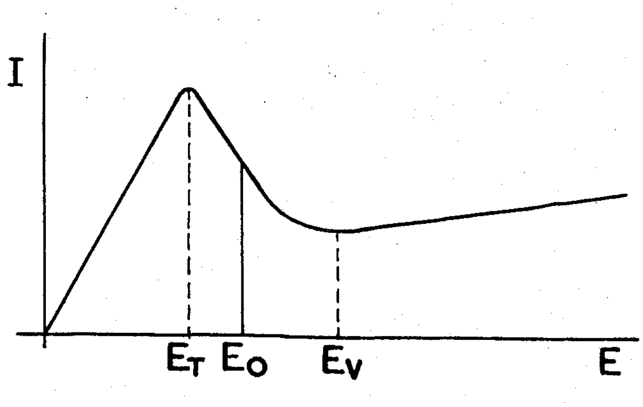
FIG. 1 is a graph of current density plotted against electric field for $n$-GaAs.

This is shown in FIG. 1, which is a graph of current density plotted against electric field for $n$-GaAs. The current density I rises rapidly and linearly from zero to a maximum at a threshold field $E_T$ and then falls with increasing field to a minimum at a valley field $E_V$. When the field is greater than $E_V$ the current density rises slowly with increasing field. In the vicinity of the bias field $E_o$, $E_T < E_o < E_V$, any small changes in electric field are accompanied by changes in current density of such a plane as to imply a negative resistance. Thus a periodic signal imposed upon the field $E_o$ encounters an effectively negative conductivity material and is amplified.

In a body with flat and parallel surfaces multiple reflections must be taken into account. The surface reflection coefficient rr* is given by $$rr^* = [(k_R - k_O)^2 + k_i^2]/[(k_O + k_R)^2 + k_i^2]$$

and is, for the frequencies and specimen resistivities of interest, strongly dependent upon free-electron concentration, and may approach unity. Within the cavity formed by the body, therefore, three operational regimes can be distinguished, namely:

a. Broadband amplification with matched (or bloomed) surfaces ($rr^*=0$, Gain $=\exp(-2k_ia)$, a being the length of the body in the propagation direction.)

b. Narrow-band amplification ($rr^*\exp(2k_ia) < 1$). The signal is multiply reflected within the body, experience gain irrespective of direction of propagation owing to the reciprocal nature of the gain process.

c. Oscillation ($rr^*\exp(-2k_ia) > 1$). The signal reflected within the body experiences round-trip gain.

The choice of operational regime must take into account the following two limitations.

The foregoing remarks have neglected the problem of applying a biasing field to a body with a negative differential conductivity. In some materials domain formation is inhibited by a suitable choice of product NL, L being the length of the body measured parallel to $E_O$ and N the free carrier concentration. However it is well known that as a consequence of the negative differential conductivity the electric field must then be spatially non-uniform. This behaviour becomes more marked as the strength of the negative differential conductivity is increased.

Figure 2:
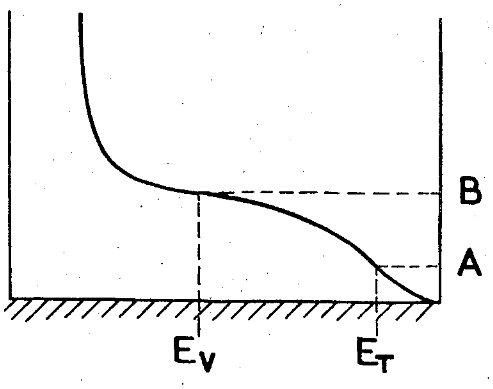
FIG. 2 is a graph of local electric field plotted as a function of distance along the $x$ axis within the body.

This is shown for *n*-GaAs in FIG. 2, where the local electric field is plotted as a function of distance along the *x* axis within the body. The body is assumed to have ohmic contacts. Thus the field E as the cathode is low and rises rapidly through a region of positive conductivity as E increases to the value $E_T$. When E is greater than $E_T$, the sign of the curvature is reversed owing to the negative differential conductivity and the field rises very rapidly to the value $E_V$. For greater values of E the field tends towards a spatially uniform value.

The second limitation concerns the complexities of the transport process contained within the terms $\sigma_R$ and $\sigma_i$. The microwave electric fields are small in comparison to the bias field in the present experiment, and therefore a local conductivity appropriate to a particular bias field may be used in equations (1) and (2). It is well known that this conductivity will not necessarily be equal to the "slope" conductivity, as defined by the gradient of the velocity-field characteristic owing to the inertia of the electron system. It follows that there is a maximum frequency beyond which negative differential conductivity will not occur.

Figure 3:
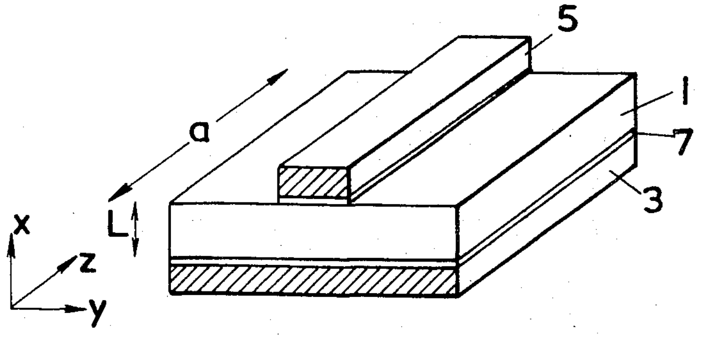
FIG. 3 is a perspective view of a body of material suitable for the device, illustrating its construction.

FIG. 3 is a perspective view of a body of material suitable for the device, illustrating its construction. A body 1 of n-GaAs has an $n^+$-type layer diffused on two opposite faces. A microwave stripline having a ground plane 3 and a live plane 5 is attached to the body 1 on its n+ faces by ohmic contacts. The ohmic contact to the ground plane 3 is made by putting a layer 7 of silver paint on the ground plane 3 and positioning the body 1 on the paint while it is still wet. The ohmic contact to the live plane 5 is made in a similar manner.

The dimensions and resistivity of the body 1 are determined as follows. The length a in the direction of propagation of the transverse electromagnetic wave in the microstrip i.e. the *z* direction, will be a whole number of half wavelengths in the material, typically one half wavelength in the material. The free carrier concentration N of the material is determined by the N*a* product, which will have a lower bound determined by different criteria according to whether the device is to be a broadband amplifier, a narrow band amplifier or an oscillator. The first limitation above, regarding the choice of the product NL, will give an upper bound for the thickness L of the body in the *x* direction between the ground plane 3 and the live plane 5. In general the body 1 will be required to occupy the whole space between the ground plane 3 and the live plane 5, and so the thickness L will give the separation between the ground plane 3 and the live plane 5 of the microstrip. The width of the live plane 5 in the *y* direction may be determined from the dimension L in conjunction with the desired characteristic impedance of the microstrip. Therefore the dimension of the block 1 in the *y* direction is determined by the fact that the block 1 should be at least as wide as the live plane 5.

Figure 4:
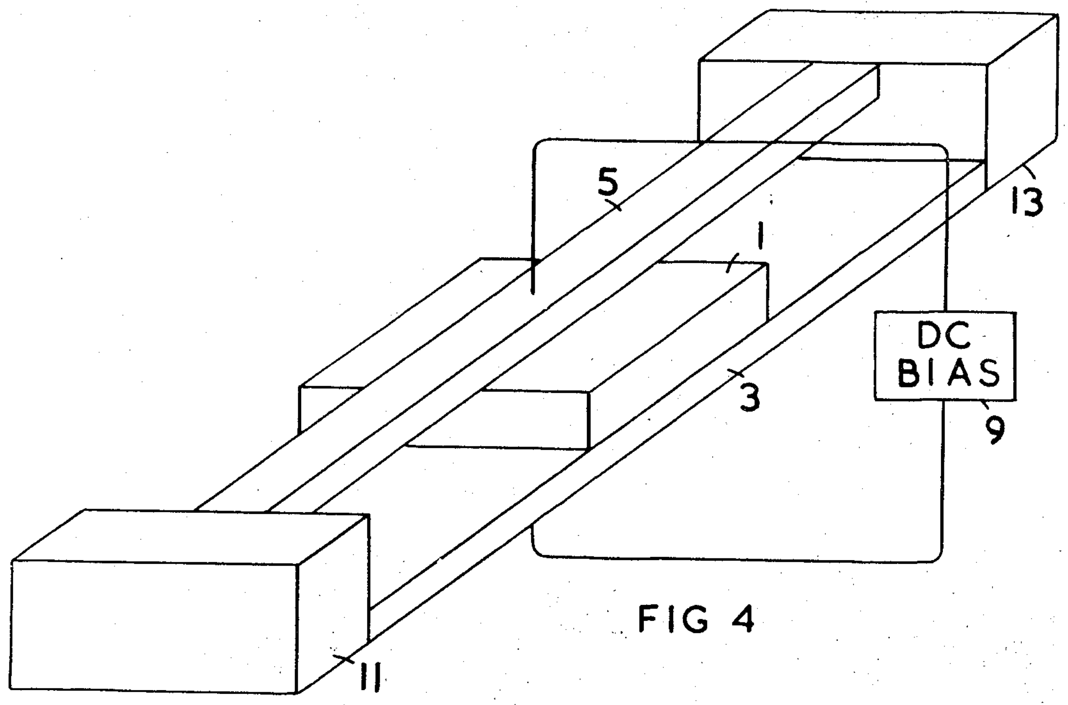
FIG. 4 is a perspective view of a microstrip narrow band amplifier.

FIG. 4 is a perspective view of a microstrip narrow band amplifier. A body of suitable material 1 is supported between the ground plane 3 and the live plane 5 of a microstrip tramsmission line. A d.c. bias source 9 is connected across the block 1 in the *x* direction. The voltage applied from the d.c. bias source 9 is such as to impose a field $E_O$ across the body 1, where $E_O$ is between $E_T$ and $E_V$. The d.c. bias source 9 may be a pulsed source. A microwave generator 11 is used to generate a transverse electromagnetic wave having a direction of propagation in the *z* direction, i.e. along the microstrip and having an E vector in the *x* direction, i.e. perpendicular to the ground plane 3. A microwave detector 13 is situated at the other end of the microstrip transmission line.

It is explained above with reference to FIG. 2 that the product NL must be less than some critical value above which domains propagate, as in the case of the transferred electron oscillator. Furthermore, in the arrangement shown in FIG. 4 amplification will only take place within a limited layer of the body 1 (between the points A and B in FIG. 2). However, there are three possible methods of overcoming these limitations.

The first method involves the use of materials in which negative differential conductivity is not accompanied by the formation of propagating domains. Such a material is indium phosphide.

Figure 5:
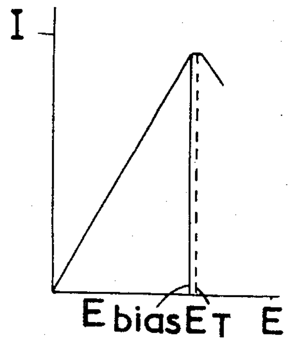
FIG. 5 is a graph of current density plotted against electric field illustrating a modified form of working.

The second method involves operation in a mode in which the space charge accumulation is limited. In this method the bias field $E_{bias}$ is slightly less than the threshold field $E_T$. Such a bias voltage is illustrated in FIG. 5, which is a graph of current density plotted against electric field illustrating this form of working. In such a case the body 1 has a uniform electric field distribution. Radio frequency signals of a sufficiently large magnitude run into and out of negative resistance, and may experience a mean negative resistance over a cycle. The whole of the body is now being used instead of a small portion. The considerations for working in this mode are very similar to those involved in conventional L.S.A. transferred electron devices. In particular the frequency and bias field must be such that the following two requirements are fulfilled. Firstly the time of dwell of the transverse electromagnetic wave in the negative resistance region must be sufficiently small for the space charge accumulation to be limited. Secondly the time of dwell of the transverse electromagnetic wave in the positive resistance region must be sufficiently large for any space charge accumulation which does occur to decay.

Figure 6:
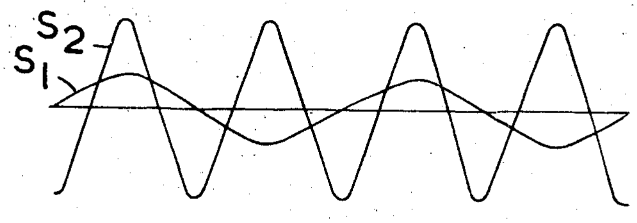
FIG. 6 is a graph of two waveforms, plotted against time, illustrating a further modified form of working.

The third method is an extension of the second method described above. This method is described with reference to FIG. 6, which is a graph of two waveforms, plotted against time. Again the bias field $E_{bias}$ is slightly less than the threshold field $E_T$. A small signal $S_1$ to be amplified is accompanied by a large signal $S_2$ at twice the frequency. The signal $S_2$ must be phase-locked to the small signal in such a way that the positive and negative peaks of the small signal $S_1$ are driven deep into the negative resistance portion of the voltage/current characteristic by the positive excursions of the large signal $S_2$. The negative excursions of the signal $S_2$ coincide only with the zero crossings of the signal $S_1$.

In all cases the product Na of the free carrier concentration and the length of the body 1 in the *z* direction must be great enough for the amplifier gain to overcome the transmission loss through the surfaces of the body 1.

Figure 7:
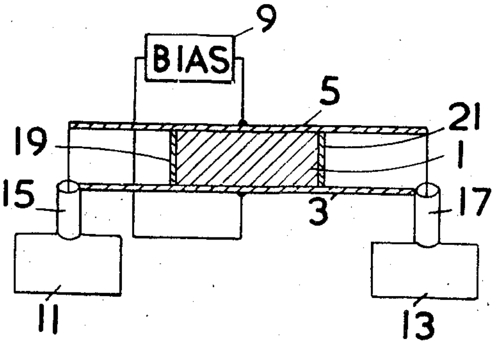
FIG. 7 is a cross-sectional diagram of a broadband amplifier.

FIG. 7 is a cross-sectional diagram of a broadband amplifier. This arrangement also illustrates the insertion and extraction of signals via coaxial lines. The radio frequency generator 11 is connected to the microstrip transmission line via a coaxial line 15 and the microstrip transmission line is connected to the radio frequency detector 13 via a coaxial line 17.

The difference in the body 1 (which makes this amplifier broadband) is that its two surfaces 19 and 21 perpendicular to the *z* direction have broadband matching systems applied to them. Such broadband matching systems are designed to reduce or eliminate reflection at the surfaces concerned. One form consists of a layer of dielectric material of such a thickness and dielectric constant as to tend to cancel reflected waves. Broad band matching systems are well understood to those in the art. They are analogous to blooming in the optical arts. In this case, the requirement of the product N*a* is modified owing to reduced transmission loss through the matched surfaces of the body 1.

As in the case of the narrow band amplifier described above with reference to FIG. 4, the product NL must be less than some critical value above which domains propagate. Furthermore, amplification will only take place within a limited layer of the body 1. Alternatively one of the three above-described methods of overcoming these limitations may be used in this case also.

Figure 8:
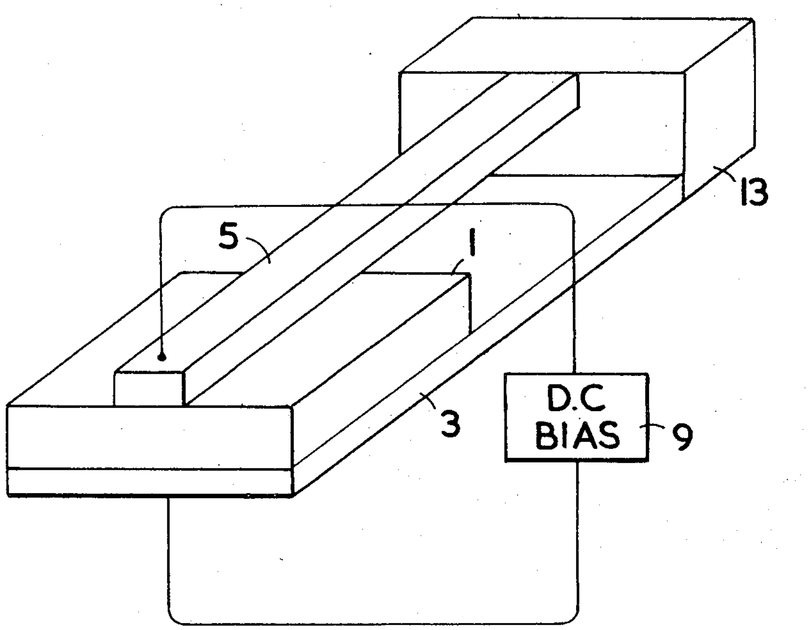
FIG. 8 is a perspective view of an oscillator.

FIG. 8 is a perspective view of an oscillator embodying the invention. In this case any signal within the body 1, such as thermal noise, will be reflected within the body and experience round-trip gain. The surfaces of the body 1 are not in this case treated with a matching system. The requirement on the product Na is such that the following condition is fulfilled:

$$rr^*\exp(-2k_i a) > 1$$

Figure 9:
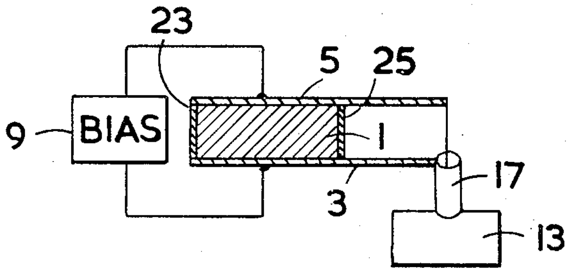
FIG. 9 is a cross-sectional diagram of an alternative oscillator.

FIG. 9 is a cross-sectional diagram of an alternative oscillator. The output of the oscillator is fed into the generator 13 via a coaxial line 17. However the important difference is that modifying layers 23, 25, for example, reflecting layers, are applied to the surfaces of the body 1 perpendicular to the direction of propagation of the transverse electromagnetic wave. In this case the surface reflection coefficient rr* can be chosen so as to optimise the system for any particular requirement, such as power output or maximum power contained within the body 1.

As in the case of the amplifiers described above with reference to FIG. 4 and FIG. 7 the product NL must be less than some critical value above which domains propagate. Furthermore, oscillation will only take place within a limited layer of the body 1. Alternatively one of the three above-described methods of overcoming these limitations may be used. The first method involves the use of materials in which negative differential conductivity is not accompanied by the formation of propagating domains and is used in the same way as in the case of an amplifier. The other two methods require some modifications.

The second method involves operation with the body 1 biased below the threshold field $E_t$. Since operation is not possible in this mode unless the signals are above a minimum amplitude it is necessary to seed the oscillations by impressing a short pulse of oscillations of the right frequency and above the minimum amplitude on the oscillator.

The third method involves operation with two signals and in the case of this oscillator the larger amplitude, higher frequency signal $S_2$ must be continuously supplied from some external generator.

What is claimed is:

1. A solid state negative conductivity device comprising:

a transmission line defining a direction of propagation of electromagnetic waves;

a body of material having a region of negative slope in its voltage/current characteristic, said body having dimensions transverse to said direction of propagation of electromagnetic waves sufficient to fill at least a substantial part of said transmission line and having a dimension in said direction of propagation of electromagnetic waves at least one half wavelength of electromagnetic waves in said body of material;

means for applying a direct electric field to said body of material in a direction perpendicular to said direction of propagation of electromagnetic waves, electromagnetic waves being propagated in said direction of propagation having an oscillatory electric vector parallel to said direct electric field, the magnitude of said direct electric field being such that said oscillatory electric vector will oscillate entirely in said region of negative slope in the voltage/current characteristic of said material; and means for extracting a transverse electromagnetic wave from said body of material.

2. A solid state device as in claim 1 constituting an amplifier and further comprising means for feeding a transverse electromagnetic wave into said body of material, the product of the free carrier concentration and the length of said body in said direction of propagation of transverse electromagnetic waves being great enough for the amplifier gain to overcome the transmission loss through the surfaces of the body of material.

3. A solid state device as in claim 1 wherein the magnitude of said direct electric field applied to said materials is such as to bias said body of material into its negative differential conductivity region.

4. A solid state device as in claim 3 wherein said material is indium phosphide.

5. A solid state device as in claim 1 wherein the magnitude of said direct electric field applied to said material is such as to bias said body of material with a field slightly less than the minimum field in which the material exhibits negative differential conductivity.

6. A solid state device as in claim 1 wherein said transmission line comprises a stripline.

7. A solid state device as in claim 1 including means for feeding a transverse electromagnetic wave to said body.

8. A solid state device as in claim 7 wherein said transverse electromagnetic wave fed to said body has a frequency twice the oscillation frequency of said oscillatory electric vector.

* * * * *